United States Patent
Guo et al.

(10) Patent No.: US 11,536,764 B2
(45) Date of Patent: Dec. 27, 2022

(54) TEST SYSTEM AND METHOD FOR SIGNAL PROCESSING

(71) Applicant: Rohde & Schwarz GmbH & Co. KG, Munich (DE)

(72) Inventors: Kevin Guo, Singapore (SG); Johann Tost, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 136 days.

(21) Appl. No.: 16/929,968

(22) Filed: Jul. 15, 2020

(65) Prior Publication Data

US 2022/0018893 A1    Jan. 20, 2022

(51) Int. Cl.
*G01R 31/28* (2006.01)
*H04B 17/00* (2015.01)

(52) U.S. Cl.
CPC ..... *G01R 31/2824* (2013.01); *H04B 17/0085* (2013.01)

(58) Field of Classification Search
None
See application file for complete search history.

(56) References Cited

U.S. PATENT DOCUMENTS

| | | | | |
|---|---|---|---|---|
| 9,869,699 B2 * | 1/2018 | Dalebroux | ......... | G01R 13/0236 |
| 10,788,201 B2 * | 9/2020 | Harriat | ................... | F24S 23/00 |
| 10,969,421 B2 * | 4/2021 | Anderson | .............. | G01R 27/28 |
| 2007/0245086 A1 | 10/2007 | Odom et al. | | |
| 2020/0241048 A1 * | 7/2020 | Frede | ..................... | G10L 15/08 |

FOREIGN PATENT DOCUMENTS

EP    1203962 A2 *    5/2002    ............. G01R 13/20

OTHER PUBLICATIONS

R&S® InstrumentView Software Manual, published in 2017, retrieved on Jul. 15, 2020 at http://www.farnell.com/datasheets/2360051.pdf, 82 pages.

* cited by examiner

*Primary Examiner* — Jermele M Hollington
(74) *Attorney, Agent, or Firm* — Ditthavong, Steiner & Mlotkowski

(57) ABSTRACT

The invention relates to a test system, comprising: a test instrument, wherein the test instrument comprises an input port configured to acquire a test signal, a display configured to display a graphical representation of the test signal, and an application interface configured to forward the test signal. The test system further comprises a test application module, which is configured to receive the forwarded test signal from the application interface, wherein the test application module comprises a processing unit configured to further process the received test signal, and an instrument interface configured to forward a result of the further processing back to the test instrument and/or to a further device.

17 Claims, 4 Drawing Sheets

TEST SYSTEM AND METHOD FOR SIGNAL PROCESSING

TECHNICAL FIELD OF THE INVENTION

The invention relates to the technical field of signal processing and analyzation. In particular, the invention relates to a test system, a method for signal processing and a computer program.

BACKGROUND OF THE INVENTION

Many test instruments, such as oscilloscopes, are configured to receive and display measurement signals. An oscilloscope, for example, typically displays a waveform of the measurement signal. After being displayed by the oscilloscopes, the measurement signal is often post processed, for instance to perform a conformance test, or simply to zoom into a section of interest of the displayed signal.

Such post processing can be performed with dedicated software, which often runs on an external device, e.g. a computer or a laptop. Typically, the user has to manually transfer the acquired test signal from the test instrument to the external device and initiate the post processing. For example, the user uploads the waveform of the measurement signal to the dedicated software and manually zooms into a section of interest of the waveform via a zoom function of the software. The user can then use a cursor or other measurement function of the software to analyze the waveform. However, this way of analyzing measurement signals can be cumbersome and slow.

The document US 2007/0245086 A1 discloses a system comprising a plurality of cartridges, wherein each of the cartridges is configured to perform a measurement and provide a signal to a respective cartridge controller, wherein the cartridge controllers are operable to adapt the signals. The system further comprises a timing and data routing logic operable to synthesize data stream(s) from the adapted input/output signals, and transmit the data stream(s), wherein the one or more data streams appear as corresponding to one or more devices. However, a user of such a system still needs to manually analyze the measurement signals, e.g. on a connected computer.

Thus, it is an objective to provide an improved test system, an improved method for signal processing, and an improved computer program, which avoid the above-mentioned disadvantages.

SUMMARY OF THE INVENTION

The object of the present invention is achieved by the solution provided in the enclosed independent claims. Advantageous implementations of the present invention are further defined in the dependent claims.

According to a first aspect, the invention relates to a test system, comprising:
 a test instrument, wherein the test instrument comprises:
  an input port configured to acquire a test signal,
  a display configured to display a graphical representation of the test signal, and
  an application interface configured to forward the test signal; and
 a test application module, which is configured to receive the forwarded test signal from the application interface, wherein the test application module comprises:
  a processing unit configured to further process the received test signal, and
  an instrument interface configured to forward a result of the further processing back to the test instrument and/or to a further device.

This achieves the advantage that the test signal can be both displayed and further analyzed in a quick and efficient way. In particular, both the graphical representation of the test signal and the further processing result are available at the test instrument, so that a user does not have to operate two devices.

In particular, the further processing of the test signal is carried out automatically, during or immediately after the signal is displayed by the test instrument. Thus, no or only minimal user input is required to display the measurement signal and to provide a result of a further processing of the measurement signal.

The further processing can be a post processing of the test signal. Preferably, the further processing facilitates and/or simplifies an analysis of the test signal.

Preferably, the test signal is an electrical, an optical or an acoustic signal. For example, the test signal is a radio frequency (RF) signal. For example, the test signal was generated by a measurement probe, which is connected to the input port of the test instrument. Alternatively, test signal may have been generated by a device under-test.

The processing unit of the test application module can be a microprocessor. Preferably, the processing unit is configured to determine the result based on the post processing.

In an embodiment, the test instrument comprises a processor, which is configured to process the acquired test signal, wherein the display is configured to display the graphical representation of the test signal based on the processed test signal. This achieves the advantage that the test signal can be visualized in a meaningful way, so that certain signal characteristics, such as limit values or a modulation frequency, can be read out. For example, the processor is a microprocessor of the test instrument.

In an embodiment, the processor is configured to execute a firmware of the test instrument, wherein the acquired test signal is processed based on the firmware.

In an embodiment, the graphical representation of the test signal shows a waveform of the test signal.

In an embodiment, the application interface of the test instrument is further configured to receive the result of the further processing of the test signal from the test application module. This achieves the advantage that the result of the further processing can be forwarded efficiently from the test application module to the test instrument.

In an embodiment, the application interface and/or the instrument interface each comprise a USB, a LAN, or a WiFi interface.

In an embodiment, the instrument interface of the test application module is further configured to receive the test signal from the test instrument. This achieves the advantage that the test signal can be forwarded efficiently from the test instrument to the test application module.

In an embodiment, the test instrument comprises the test application module. This achieves the advantage that the further processing of the test signal can be performed by the test instrument itself and no external device, e.g. a computer or laptop, is required.

In an embodiment, the test application module is comprised in an external device, for instance a PC, a laptop or a cloud server, wherein the external device is connected to the test instrument.

In an embodiment, the further processing of the received test signal by the processing unit comprises at least one of the following: performing a conformance test based on the test signal, selecting a section and/or points of the test signal, zooming into a section of the test signal, or comparing the test signal to a reference signal.

In an embodiment, the result of the further processing of the test signal comprises a further graphical representation of the test signal, in particular a further processed version of a waveform of the test signal and/or a magnified section of the waveform.

For example, the result of the further processing is a magnification of a section of the waveform, a smoothing of the waveform or a comparison of the waveform to a reference signal. A user can efficiently analyze the waveform of the test signal based on these further processing results.

In an embodiment, the display of the test instrument is configured to display the result of the further processing of the test signal. This archives the advantage that a user can directly read out the test signal and the further processing result at the test instrument. Thus, the user does not have to operate two devices.

In an embodiment, the test instrument is any one of the following instruments: an oscilloscope, an audio analyzer, a network analyzer, a signal analyzer, or a spectrum analyzer.

All the above-mentioned embodiments and/or optional features of the test system can be combined.

According to a second aspect, the invention relates to a method for signal processing, comprising:
  acquiring a test signal with a test instrument;
  displaying a graphical representation of the test signal;
  forwarding the test signal to a test application module;
  further processing the received test signal with the test application module, and
  forwarding a result of the further processing back to the test instrument or to a further device.

This achieves the advantage that the test signal can be both displayed and further analyzed in a quick and efficient way. In particular, both the graphical representation of the test signal and the further processing result are available at the test instrument, so that a user does not have to operate two devices.

In an embodiment, the method further comprising the step:
  processing the acquired test signal, preferably with a firmware of the test instrument,
wherein the graphical representation of the test signal is displayed based on the processed test signal. This achieves the advantage that test signal can be visualized in a meaningful way, so that certain signal characteristics, such as limit values or a modulation frequency, can be read out.

In an embodiment, the graphical representation of the test signal shows a waveform of the test signal.

In an embodiment, the step of further processing the received test signal with the test application module comprises at least one of the following steps:
  performing a conformance test based on the test signal;
  selecting a section and/or points of the test signal,
  zooming into a section of the test signal, or
  comparing the test signal to a reference signal.
In an embodiment, the method further comprises the step:
  displaying the result of the further processing of the test signal.

This archives the advantage that a user can directly read out the test signal and the further processing result.

All the above-mentioned embodiments and/or optional features of the method for signal processing can be combined.

The above description with regard to the test system according to the first aspect of the invention is correspondingly valid for the method for signal processing according to the second aspect of the invention.

According to a third aspect, the invention relates to a computer program comprising a program code for performing the method according to the second aspect of the invention when executed on a computer.

BRIEF DESCRIPTION OF THE DRAWINGS

The invention will be explained in the followings together with the figures.

DETAILED DESCRIPTION OF THE PREFERRED EMBODIMENTS

Figure 1:
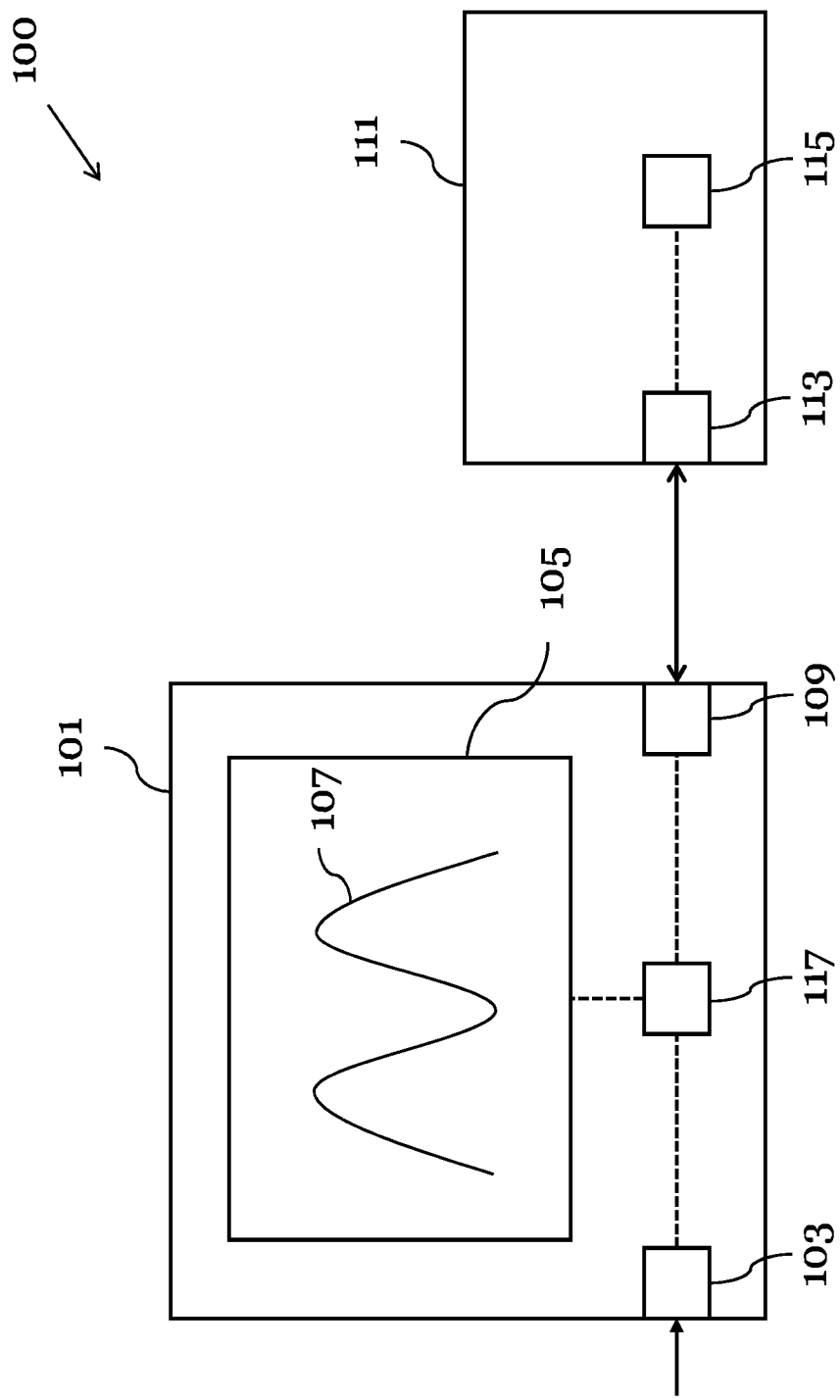
FIG. 1 shows a schematic diagram of a test system according to an embodiment.

FIG. 1 shows a schematic diagram of a test system 100 according to an embodiment.

The test system 100 comprises a test instrument 101 and a test application module 111. The test instrument 101 comprises an input port 103 configured to acquire a test signal, a display 105 configured to display a graphical representation 107 of the test signal, and an application interface 109 configured to forward, i.e. output, the test signal.

The test application module 111 is configured to receive the forwarded test signal from the application interface 109 of the tests instrument 101. The test application module 111 comprises a processing unit 115 configured to further process the received test signal, and an instrument interface 113 configured to forward a result of the further processing of the test signal back to the test instrument 101 and/or to a further device.

The test instrument 101 can be any one of the following instruments: an oscilloscope, an audio analyzer, a network analyzer, a signal analyzer, or a spectrum analyzer. More generally, the test instrument 101 can be a measurement device and the test signal can be a measurement signal, which is acquired by the measurement device.

The test signal can be an electrical, an optical or an acoustic signal. For example, the test signal is a radio frequency (RF) signal. In particular, the test signal was generated by a measurement probe, which is connected to the input port 103 of the test instrument 101. The input port 103 can comprise an electrical plug connector, e.g. a BNC connector, to which the measurement probe can be connected. The test signal can also originate from a device under test, which is connected to the test instrument.

In particular, the test instrument 101 is configured to acquire the test signal by triggering and storing the signal in an acquisition memory of the instrument 101.

The display 105 can be a screen of the test instrument 101. The screen can be integrated in a housing of the test instrument 101.

Preferably, the test instrument 101 comprises a processor 117, which is configured to process the acquired test signal. The processor 117 can be configured to execute a firmware of the test instrument 101 in order to process the test signal. The firmware can be a specific class of computer software that provides a low-level control of device specific hardware, in particular the test instrument 101 hardware.

In particular, the processor 117 is configured to generate the graphical representation 107 of the test signal, which is then displayed by the display 105. As shown in FIG. 1, the graphical representation of the test signal can be a waveform of the test signal, especially if the test instrument 101 is an oscilloscope or a s spectrum analyzer.

The test application module 111 can be an external device, as shown in FIG. 1, or can be comprised in an external device, which is connected to the test instrument. The external device can be a personal computer (PC), a laptop or a cloud server.

Alternatively, the test instrument 101 can comprise the test application module 111, i.e. the test application module 111 is integrated into the test instrument 101.

The processing unit 115 of the test application module 111, e.g. a microprocessor, can be configured to run a test application, i.e. a software in the meaning of a more hardware-independent piece of code, to further process the test signal. The test application can run on the device into which the test application module 111 is integrated, e.g. a PC, a laptop, a cloud server, or the test instrument 101 itself.

The further processing, which is performed by the processing unit 115, can be a post processing of the test signal. For example, the further processing can be a conformance test, in particular a conformance offline waveform test, performed on the test signal. The conformance testing can comprise testing if the test signal complies with certain predefined requirements, specifications or technical standards. These requirements or standards refer, for example, to a signal strength, a signal frequency or a noise level of the test signal. Alternatively or additionally, the further processing can comprise a selection of a section and/or points of the test signal, a zooming into a section of the test signal, or a comparison of the test signal to a reference signal.

The result of the further processing, which is determined by the processing unit 115, can comprise a further graphical representation, e.g. a zoomed in section of the test signal. This further graphical representation can be forwarded back to the test instrument 101 and displayed on the display 105 of the test instrument 101, preferably next to the graphical representation 107 of the measurement signal.

In particular, the forwarding of the test signal to the test application module 111, the further processing of the test signal at the module 111 and the forwarding of the further processing result to the test instrument 101 can be carried out automatically without requiring user input. This saves time and allows the user to analyze the test signal directly on the test instrument.

In addition, also the measurement of the test signal by the test instrument 101, i.e. the processing of the test signal and the display of the graphical representation 107, can be carried out automatically as well, which can lead to further time saving.

Preferably, the application interface 109 of the test instrument 101 and the instrument interface 109 of the test application module 111 are both two-way interfaces. For example, the application interface 109 can be configured to receive the result of the further processing from the test application module 111. In particular, the application interface 109 comprises a submodule for forwarding the test signal to the test application module 111 and a further submodule for receiving the further processing result. Likewise, the instrument interface 113 of the test application module 111 can be configured to receive the test signal from the test instrument 101. Therefore, the instrument interface 113 may also comprise two submodules for forwarding, respectively receiving, signals.

The instrument interface 113 can be configured to forward the further processing result back to the test instrument 101 or to a further device (not shown). The further device can be a computer or laptop, which can be used to further analyze the test signal based on the further processing result.

For example, the application interface 109 and/or the instrument interface 113 are USB, WiFi or LAN interfaces.

Figure 2A:
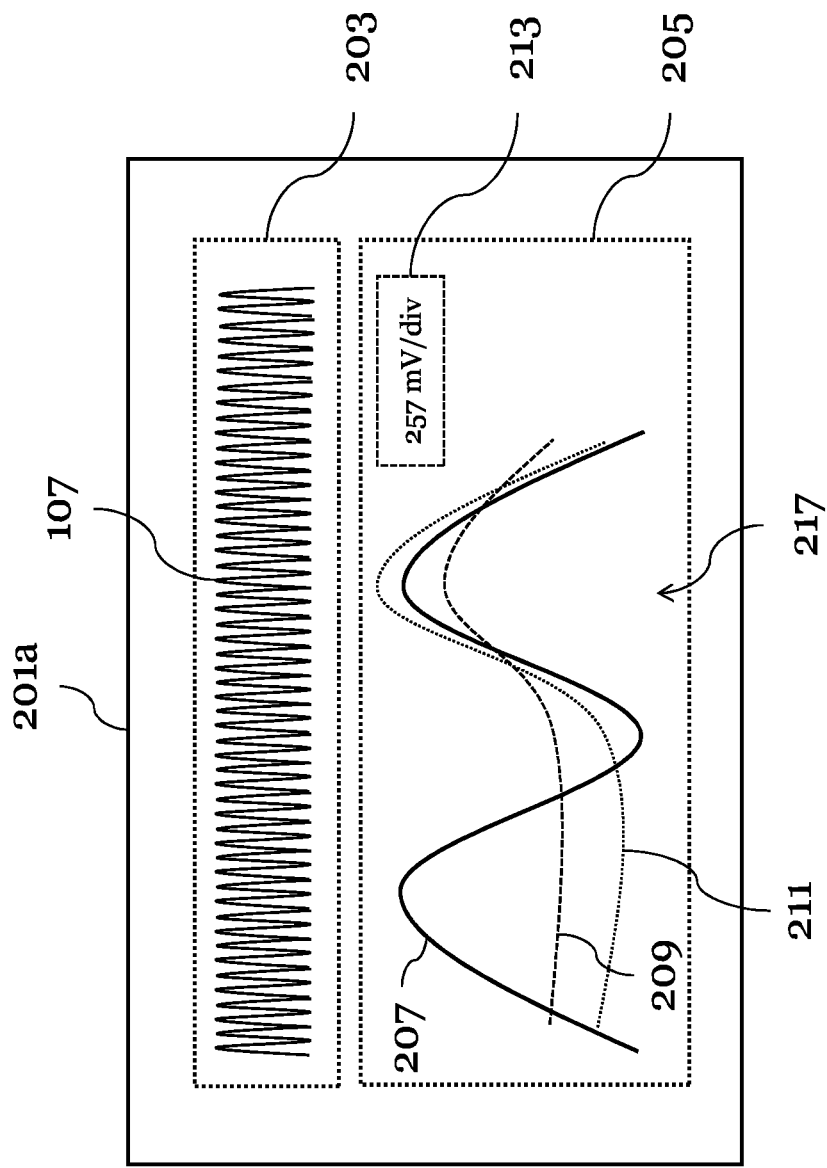
FIG. 2a shows a schematic diagram of a display view according to an embodiment.

FIG. 2a shows a schematic diagram of a display view 201a according to an embodiment. The display view 201a can be displayed by the display 105 of the test instrument 101.

The display view 201a comprises a first display section 203, which shows the graphical representation 107 of the acquired test signal. Thereby, the graphical representation 107 is a waveform of the test signal. To generate the representation of the waveform, the test signal may have been processed by the processor 117 of the test instruments 101.

The display view 201a comprises a second display section 205, which shows the result 217 of the further processing of the test signal. In FIG. 2a, this result 217 comprises further graphical representations, in particular a magnified waveform 207 of the test signal and two reference waveforms 209, 211. The second display section 205 may further comprise an area 213 which shows values determined during the further processing.

By displaying the acquired test signal 107 and the result 217 of the post processing side by side on the display 105, a user can quickly and easily verify and analyze a measurement result of the test instrument 101. In particular, the user does not have to manually transfer the test signal from the test instrument 101 to another device to initiate the further processing and display the further processing result 217.

Figure 2B:
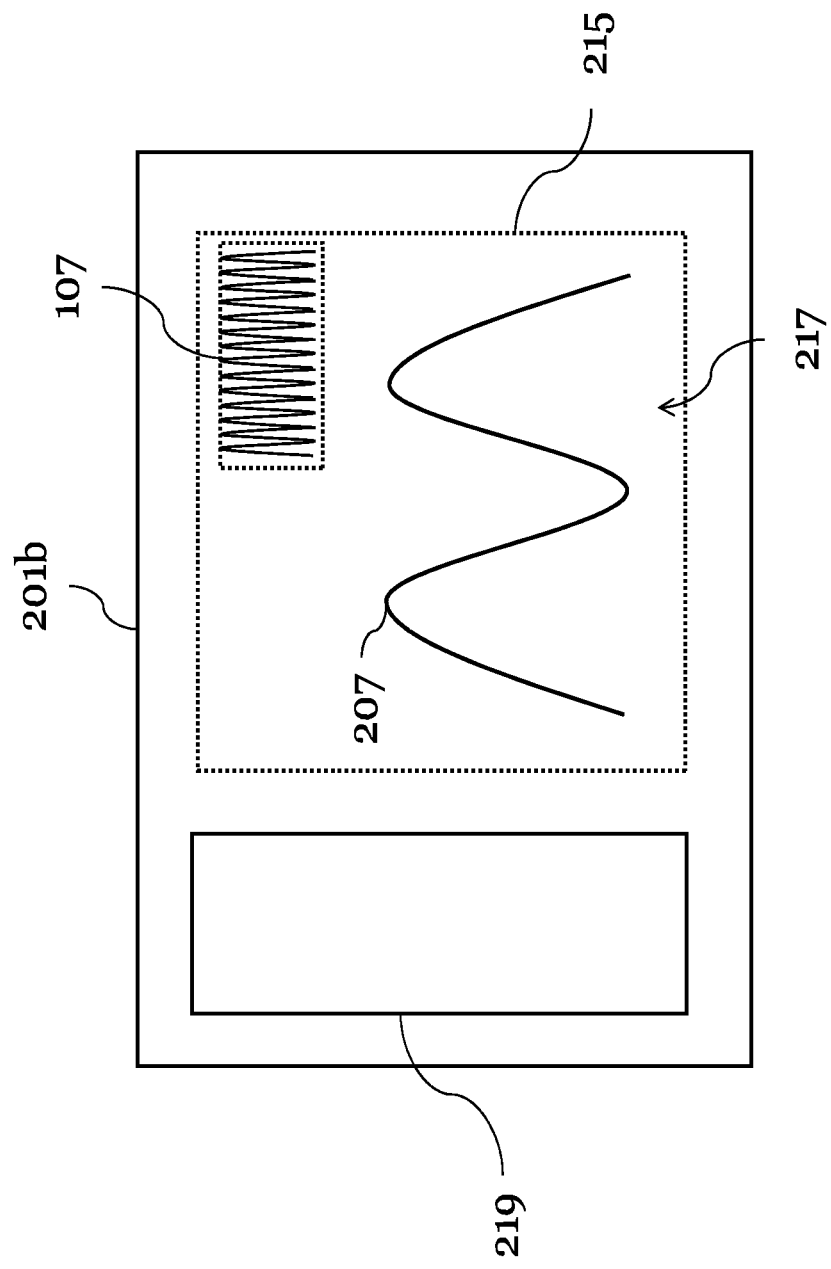
FIG. 2b shows a schematic diagram of a further display view according to an embodiment.

FIG. 2b shows a schematic diagram of a further display view 201b according to an embodiment.

The further display view 201b comprises a display section 215, which shows the graphical representation 107 of the test signal, in particular the waveform of the test signal, and the result 217 of the further processing, in particular the magnified waveform 207 of the waveform. The display view 201b comprises a further area 219, which can display control elements for controlling the further processing of the test signal.

The further display view 201b can be generated by a conformance test application. The conformance test application can be a software running on the test application module 111. The user can use this application to specify parameters of a conformance test, e.g. AC or DC input levels for electrical tests. Alternatively, the further display view 201b can be displayed on the display 105 of the test instrument 101.

Figure 3:
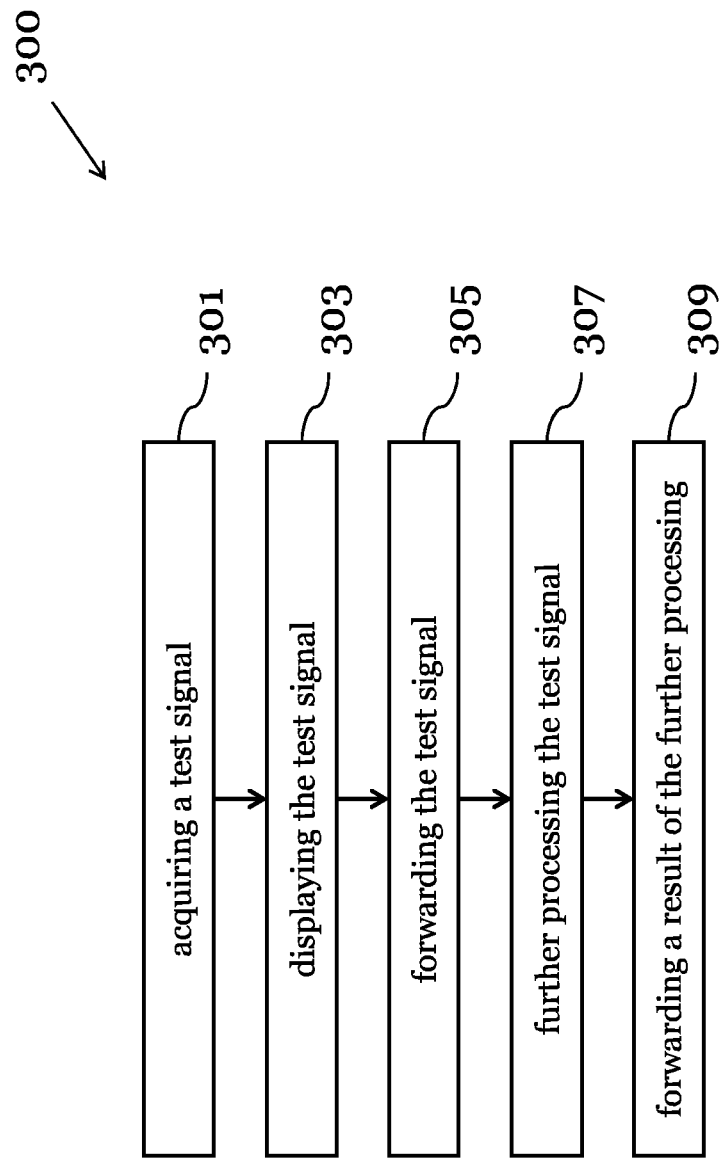
FIG. 3 shows a schematic diagram of a method for signal processing according to an embodiment.

FIG. 3 shows a schematic diagram of a method 300 for signal processing according to an embodiment.

For example, the method 300 can be used to display and further process the test signal. The method 300 can be carried out by the test system 100 as shown in FIG. 1.

The method 300 comprises the following steps:
acquiring 301 the test signal with the test instrument 101;
displaying 303 the graphical representation 107 of the test signal;
forwarding 305 the test signal to the test application module 111;
further processing 307, in particular post processing, the received test signal with the test application module 111, and forwarding 309 the result 217 of the further processing back to the test instrument 101 or to a further device.

The method 300 may further comprise the step of: processing the acquired test signal, preferably with a firmware of the test instrument. The graphical representation 107 of the test signal, e.g. a waveform of the test signal, can be generated based on the processing of the test signal.

According to an embodiment, the method 300 further comprises the step of:

displaying the result of the further processing of the test signal, in particular on the display 105 of the test instrument 101.

The step of further processing 307 the received test signal with the test application module 111, can comprises at least one of the following steps:

performing a conformance test based on the test signal;
selecting a section and/or points of the test signal,
zooming into a section of the test signal, or
comparing the test signal to a reference signal.

All features of all embodiments described, shown and/or claimed herein can be combined with each other.

The invention claimed is:

1. A test system, comprising:
    a test instrument, wherein the test instrument comprises:
        an input port configured to acquire a test signal,
        a display configured to display a graphical representation of the test signal, and
        an application interface configured to forward the test signal; and
    a test application module, which is external to the test instrument and is configured to receive the forwarded test signal from the application interface, wherein the test application module comprises:
        a processing unit configured to further process the received test signal, wherein the further processing comprises performing a conformance test based on the test signal, and
        an instrument interface configured to forward a result of the further processing back to the test instrument.

2. The test system of claim 1, wherein the test instrument comprises a processor, which is configured to process the acquired test signal, wherein the display is configured to display the graphical representation of the test signal based on the processed test signal.

3. The test system of claim 2, wherein the processor is configured to execute a firmware of the test instrument, wherein the acquired test signal is processed based on the firmware.

4. The test system of claim 1, wherein the graphical representation of the test signal shows a waveform of the test signal.

5. The test system of claim 1, wherein the application interface of the test instrument is further configured to receive the result of the further processing of the test signal from the test application module.

6. The test system of claim 1, wherein the application interface and/or the instrument interface each comprise a USB, a LAN, or a WiFi interface.

7. The test system of claim 1, wherein the instrument interface of the test application module is further configured to receive the test signal from the test instrument.

8. The test system of claim 1, wherein the test application module is comprised in an external device, wherein the external device is connected to the test instrument.

9. The test system of claim 1, wherein the further processing of the received test signal by the processing unit further comprises at least one of the following:
    selecting a section and/or points of the test signal, zooming into a section of the test signal, or comparing the test signal to a reference signal.

10. The test system of claim 1, wherein the result of the further processing of the test signal comprises a further graphical representation of the test signal, in particular a further processed version of a waveform and/or a magnified section of the waveform.

11. The test system of claim 1, wherein the display of the test instrument is configured to display the result of the further processing of the test signal.

12. The test system of claim 1, wherein the test instrument is any one of the following instruments: an oscilloscope, an audio analyzer, a network analyzer, a signal analyzer, or a spectrum analyzer.

13. A method for signal processing, comprising:
    acquiring a test signal with a test instrument;
    displaying a graphical representation of the test signal;
    forwarding the test signal to a test application module which is external to the test instrument;
    further processing the received test signal with the test application module, wherein the further processing comprises performing a conformance test based on the test signal; and
    forwarding a result of the further processing back to the test instrument.

14. The method of claim 13, further comprising the step:
    processing the acquired test signal, preferably with a firmware of the test instrument, wherein the graphical representation of the test signal is displayed based on the processed test signal.

15. The method of claim 13, wherein the graphical representation of the test signal shows a waveform of the test signal.

16. The method of claim 13, wherein the step of further processing the received test signal with the test application module, comprises at least one of the following steps:
    selecting a section and/or points of the test signal,
    zooming into a section of the test signal, or
    comparing the test signal to a reference signal.

17. The method of claim 13, wherein the method further comprises the step of:
    displaying the result of the further processing of the test signal.

* * * * *